(12) United States Patent
Minzoni

(10) Patent No.: US 10,769,012 B2
(45) Date of Patent: Sep. 8, 2020

(54) MEMORY WITH ERROR CORRECTION FUNCTION AND AN ERROR CORRECTION METHOD

(71) Applicant: XI'AN UNIIC SEMICONDUCTORS CO., LTD., Xi'an Shaanxi (CN)

(72) Inventor: Alessandro Minzoni, Xi'an Shaanxi (CN)

(73) Assignee: XI'AN UNIIC SEMICONDUCTORS CO., LTD., Xi'an Shaanxi (CN)

( * ) Notice: Subject to any disclaimer, the term of this patent is extended or adjusted under 35 U.S.C. 154(b) by 127 days.

(21) Appl. No.: 15/982,131

(22) Filed: May 17, 2018

(65) Prior Publication Data

US 2018/0336090 A1 Nov. 22, 2018

(30) Foreign Application Priority Data

May 17, 2017 (CN) .......................... 2017 1 0349631

(51) Int. Cl.
*G06F 11/10* (2006.01)
*G11C 29/52* (2006.01)
*G11C 29/42* (2006.01)
*G11C 29/04* (2006.01)

(52) U.S. Cl.
CPC ...... *G06F 11/1044* (2013.01); *G06F 11/1048* (2013.01); *G06F 11/1068* (2013.01); *G11C 29/52* (2013.01); *G11C 29/42* (2013.01); *G11C 2029/0411* (2013.01)

(58) Field of Classification Search
CPC ............. G06F 11/1044; G06F 11/1048; G06F 11/1068; G11C 29/52; G11C 2029/0411; G11C 29/42
USPC ........................................................ 714/763
See application file for complete search history.

(56) References Cited

U.S. PATENT DOCUMENTS

| 5,856,988 A * | 1/1999 | Kiriyama | H03M 13/35 |
| | | | 714/701 |
| 6,233,251 B1 * | 5/2001 | Kurobe | H04N 21/2368 |
| | | | 370/471 |
| 2001/0025334 A1 * | 9/2001 | Fuma | G11B 20/10 |
| | | | 711/113 |

(Continued)

*Primary Examiner* — James C Kerveros
(74) *Attorney, Agent, or Firm* — Leydig, Voit & Mayer, Ltd.

(57) ABSTRACT

The present invention relates to a memory with error correction function, comprising a data array, an ECC array, a flag bit array, an ECC encoding module, an ECC decoding module, a flag bit generation module and a flag bit detection module; wherein: the flag bit generation module is configured, when data is being written, to generate a flag bit and an encode enable signal, the flag bit being stored in the flag bit array, and the encode enable signal being used to control the operation of the ECC encoding module; the ECC encoding module is configured to encode the data to be written according to the ECC algorithm preset therein so as to generate parity bits; the ECC array is configured to store the generated parity bits; the flag bit detection module is configured, when data is being read, to detect the flag bit and control the operation of the ECC decoding module; and the ECC decoding module is configured to detect and correct erroneous data using the parity bits from the ECC array and the data from the data array, and to output the corrected data. The invention also relates to a method of correcting errors in a memory.

10 Claims, 3 Drawing Sheets

(56) References Cited

U.S. PATENT DOCUMENTS

| | | | |
|---|---|---|---|
| 2001/0043804 A1* | 11/2001 | Nakatani | G11B 20/10527 386/241 |
| 2003/0163695 A1* | 8/2003 | Irisawa | G06F 21/31 713/170 |
| 2008/0109705 A1* | 5/2008 | Pawlowski | G06F 11/1044 714/767 |
| 2009/0276680 A1* | 11/2009 | Chiu | G06F 11/1068 714/752 |
| 2014/0006906 A1* | 1/2014 | Shiga | G06F 11/1072 714/773 |
| 2017/0123904 A1* | 5/2017 | Park | G06F 11/1068 |
| 2017/0255513 A1* | 9/2017 | Saito | G06F 11/1068 |

* cited by examiner

MEMORY WITH ERROR CORRECTION FUNCTION AND AN ERROR CORRECTION METHOD

CROSS-REFERENCE TO RELATED APPLICATIONS

This application claims priority under 35 USC 119(a) to Chinese Application No. 201710349631.8, filed May 17, 2017, which is hereby incorporated by reference in its entirety.

TECHNICAL FIELD

The present invention relates to a memory with error correction function and a method of correcting errors in the memory.

BACKGROUND ART

ECC (i.e. Error Correction Code) can be used to detect and correct erroneous data by adding parity bits to data bits of a certain length. The conventional read and write processes for memory with error correction function are shown as FIGS. 1-2. FIG. 1 schematically shows a write process. A data array 1 is used to store data, and an ECC array 2 is used to store parity bits of ECC. When N-bit data are written into the memory from the system, M-bit parity bits are generated by an ECC encoding module 3 using the N-bit data, and then the N-bit data together with the M-bit parity bits are written into the corresponding memory arrays. The data length N is greater than zero, and is less than or equal to the data length for performing one read-write operation in the memory. The length M of the parity bits is greater than zero, and its value depends on the selected ECC algorithm.

FIG. 2 schematically shows a read process. N-bit data and M-bit parity bits are read from the corresponding memory arrays, and then are transferred to an ECC decoding module 4 after being amplified. The ECC decoding module 4 can detect and correct erroneous data, and read the corrected N-bit data.

From the write process in FIG. 1, it can be known that when the ECC encoding module 3 generates M-bit parity bits, the data length N are required, which is determined by the selected ECC algorithm. Nevertheless, with respect to memory, the lengths of the valid input data are not unchanged. For example, there are following provisions in Dynamic Random Access Memory (DRAM): if there is Burst Chop Mode, the data length will vary such that the data length is less than N; or for structure with different data lengths, for example in the modes of X4, X8, X16 and so on, the data length will vary as a function of the external control such that the data length is not equal to N. Once an ECC algorithm is selected, the data length required by the corresponding ECC encoding module is determined, and if the data length varies, the parity bits of ECC cannot be generated successfully. Where a minimum data length could be found under all the constraints that may occur, and according to such a minimum data length, the ECC algorithm is selected, all of the modes can be supported. But if the minimum data length is 8, even for the most efficient Hamming code, at least 4-bit parity bits are required, which may increase at least 50% of the memory array area in order to store parity bits of ECC. This leads to a dramatic increase in the cost of memory, and reduces the flexibility and efficiency in the selection of ECC algorithm.

Therefore, there is a need to provide a memory with error correction function that is compatible with different data lengths.

SUMMARY OF THE INVENTION

According to a first aspect of the present invention, there is provided a memory with error correction function, comprising a data array, an ECC array, a flag bit array, an ECC encoding module, an ECC decoding module, a flag bit generation module and a flag bit detection module; wherein:

the data array is configured to store the data to be written;

the flag bit generation module is configured, when data is being written, to generate a flag bit and an encode enable signal in response to the one or more external control signals that affect the length of the data to be written, the flag bit being stored in the flag bit array, and the encode enable signal being used to control the operation of the ECC encoding module;

the ECC encoding module is configured, when the encode enable signal is enabled, to receive the data to be written and encode the data to be written according to the ECC algorithm preset therein so as to generate parity bits;

the ECC array is configured to store the generated parity bits;

the flag bit detection module is configured, when data is being read, to detect the flag bit, and in response to the flag bit, to generate a decode enable signal for controlling the operation of the ECC decoding module; and the ECC decoding module is configured, when the decode enable signal is enabled, to detect and correct erroneous data using the parity bits from the ECC array and the data from the data array, and to output the corrected data.

According to a preferred embodiment, the external control signals are signals corresponding to X4, X8 or X16 mode or signals corresponding to the combination of burst chop mode with one of X4, X8 and X16 modes.

According to a preferred embodiment, if the length of the data to be written is consistent with the data length required by the ECC algorithm, the generated encode enable signal is an encode enable signal enabling the operation of the ECC encoding module.

According to a preferred embodiment, if the length of the data to be written is inconsistent with the data length required by the ECC algorithm, the generated encode enable signal is an encode enable signal disabling the operation of the ECC encoding module.

According to a preferred embodiment, when data is being read, if the flag bit indicates that the length of the data stored at the corresponding address is consistent with that required by the ECC algorithm, the generated decode enable signal is a decode enable signal enabling the operation of the ECC decoding module.

According to a preferred embodiment, when data is being read, if the flag bit indicates that the length of the data stored at the corresponding address is inconsistent with that required by the ECC algorithm, the generated decode enable signal is a decode enable signal disabling the operation of the ECC decoding module.

According to another aspect of the present invention, there is provided a method of correcting errors in a memory comprising a data array, an ECC array, a flag bit array, an ECC encoding module, an ECC decoding module, a flag bit generation module and a flag bit detection module, the method of correcting errors in the memory comprising:

when data is being written, storing the data to be written in the data array and generating a flag bit and an encode enable signal by the flag bit generation module in response to the one or more external control signals that affect the length of the data to be written, storing the generated flag bit in the flag bit array and controlling the ECC encoding operation of the ECC encoding module according to the encode enable signal, wherein if the encode enable signal is enabled, performing ECC encoding of the data to be written according to the preset ECC algorithm and storing parity bits generated by ECC encoding;

when data is being read, detecting the flag bit by the flag bit detection module and in response to the flag bit, generating a decode enable signal so as to control ECC decoding operation, wherein if the decode enable signal is enabled, performing ECC decoding and reading the data, and if the decode enable signal is disabled, performing no ECC decoding and reading the data.

According to a preferred embodiment, the external control signals are signals corresponding to X4, X8 or X16 mode or signals corresponding to the combination of burst chop mode with one of X4, X8 and X16 modes.

According to a preferred embodiment, when data is being written, if the length of the data to be written is consistent with the data length required by the ECC algorithm, the generated encode enable signal is an encode enable signal enabling the operation of the ECC encoding module.

According to a preferred embodiment, when data is being written, if the length of the data to be written is inconsistent with the data length required by the ECC algorithm, the generated encode enable signal is an encode enable signal disabling the operation of the ECC encoding module.

According to a preferred embodiment, when data is being read, if the flag bit indicates that the length of the data stored at the corresponding address is consistent with that required by the ECC algorithm, the generated decode enable signal is a decode enable signal enabling the operation of the ECC decoding module.

According to a preferred embodiment, when data is being read, if the flag bit indicates that the length of the data stored at the corresponding address is inconsistent with that required by the ECC algorithm, the generated decode enable signal is a decode enable signal disabling the operation of the ECC decoding module.

The memory and the method of correcting errors in the memory according to the present invention have at least the following advantages: being adaptive to any ECC algorithm, and thus gaining the more flexibility and efficiency in the selection of ECC algorithm; being compatible with different data lengths; being not affected by burst chop mode, X4, X8 and X16 modes; reducing the power dissipation; and being not influencing the functions and timing sequences of conventional write operation and read operation.

BRIEF DESCRIPTION OF THE DRAWINGS

The advantages and features of the present invention will become apparent from the embodiments described below with reference to the accompanying drawings, wherein.

DETAILED DESCRIPTION OF THE INVENTION

It should be understood that the specific examples described herein are intended to facilitate better understanding of the present invention and are not intended to limit the present invention.

Figure 1:
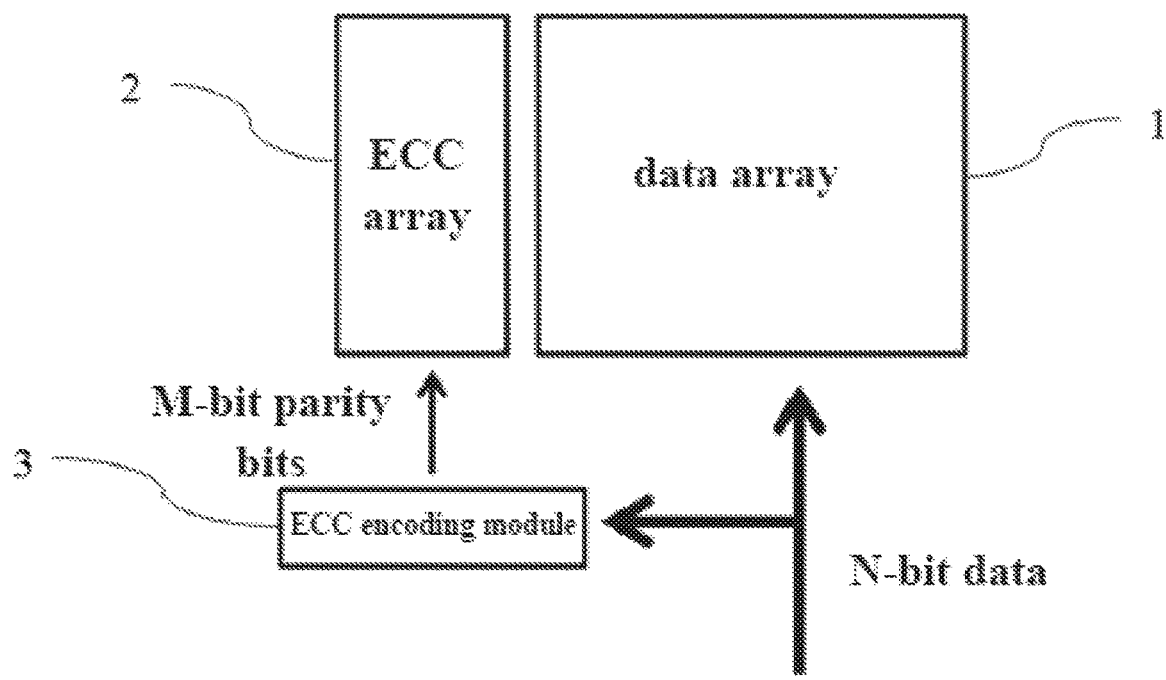
FIG. 1 schematically shows a write process of a memory.
Figure 2:
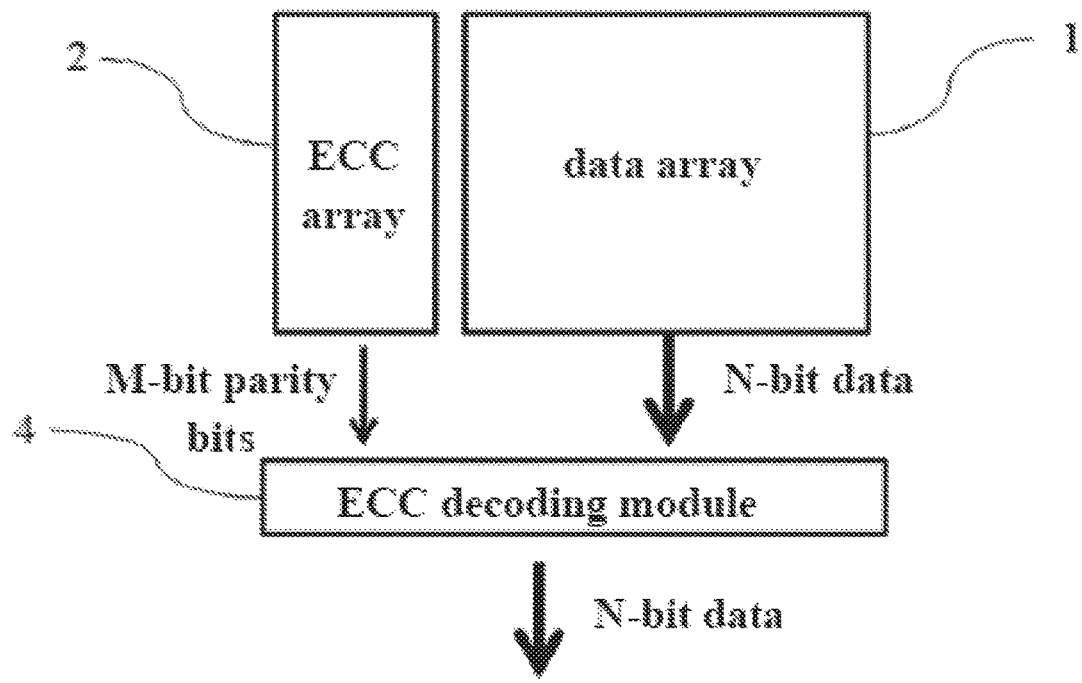
FIG. 2 schematically shows a read process of a memory.
Figure 3:
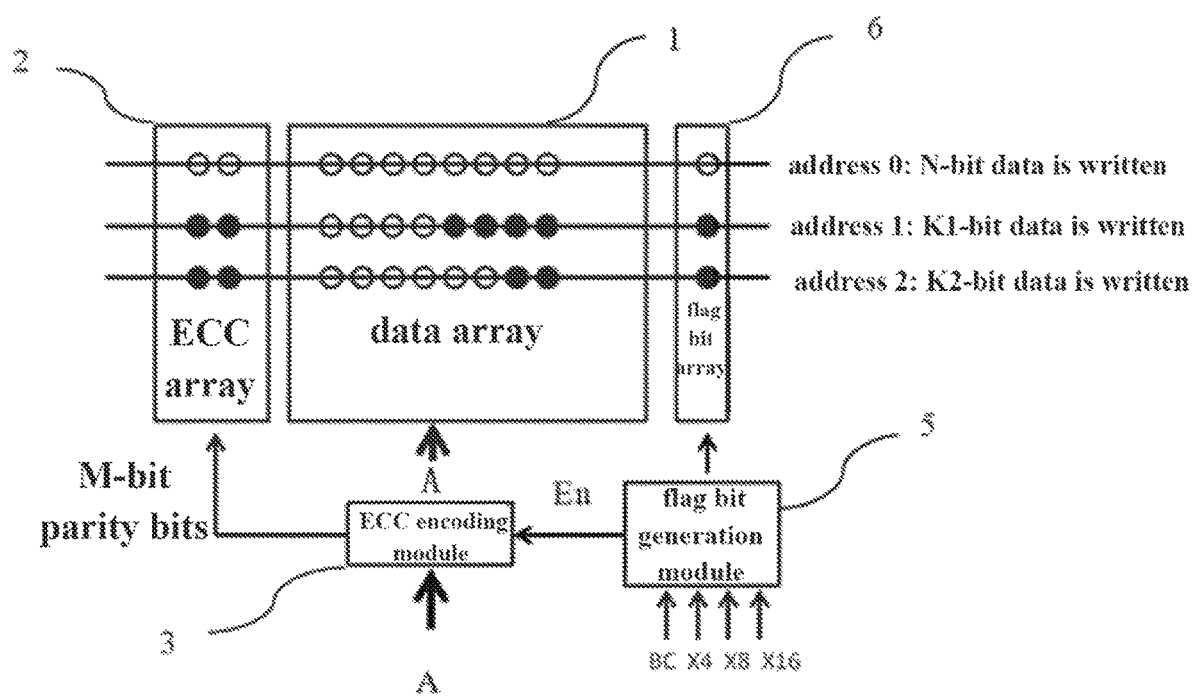
FIG. 3 schematically shows a write process of the memory with error correction function according to the present invention.
Figure 4:
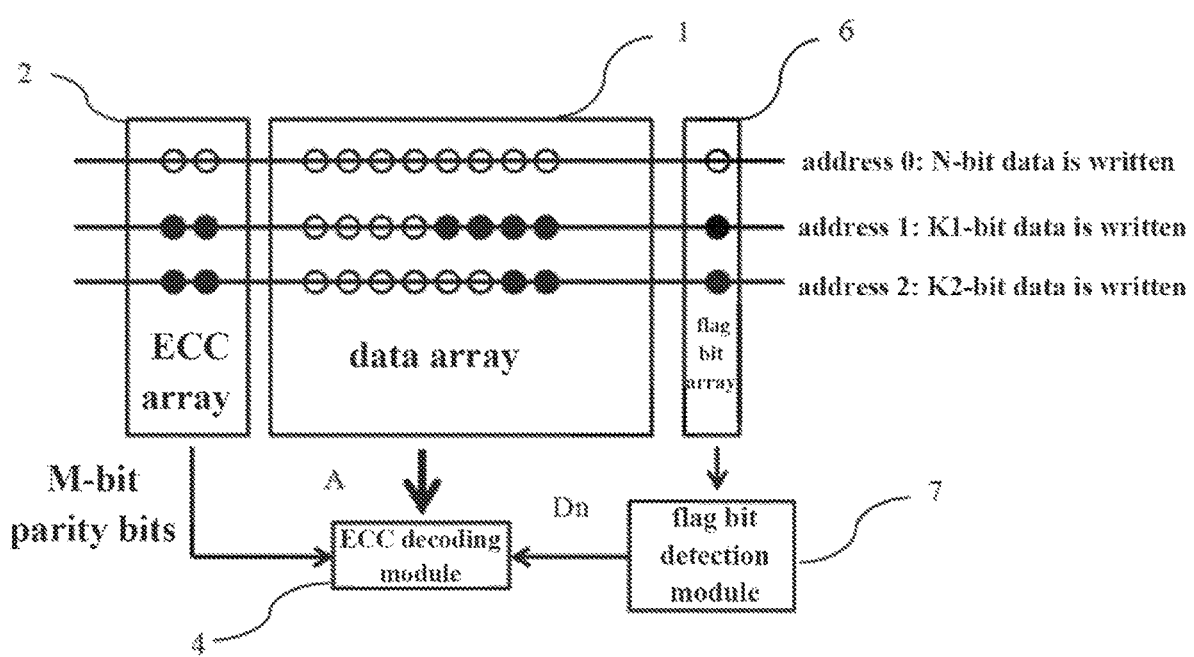
FIG. 4 schematically shows a read process of the memory with error correction function according to the present invention.

The memory with error correction function of the present invention will now be described in more detail with reference to FIGS. 3-4. The memory generally comprises a data array 1, an ECC array 2, an ECC encoding module 3, an ECC decoding module 4, a flag bit generation module 5, a flag bit array 6 and a flag bit detection module 7.

According to the present invention, the data array 1 is configured to store the data to be written. The flag bit generation module 5 is configured, when data is being written, to generate a flag bit and an encode enable signal En in response to the one or more external control signals (for example, the external control signals corresponding to X4, X8 or X16 mode, or the external control signals corresponding to the combination of burst chop mode with one of X4, X8 and X16 modes) that affects the length of the data to be written. The flag bit is stored in the flag bit array 6, and the encode enable signal En is used to control the operation of the ECC encoding module 3. The ECC encoding module 3 is configured, when the encode enable signal En is enabled, to receive the data to be written, and to encode the data to be written according to the ECC algorithm preset therein, so as to generate parity bits, and when the encode enable signal En is disabled, not to perform the ECC encoding. The ECC array 2 is configured to store the generated parity bits.

The flag bit detection module 7 is configured, when data is being read, to detect the flag bit, and in response to the flag bit, to generate a decode enable signal Dn for controlling the operation of the ECC decoding module 4. The ECC decoding module 4 is configured, when the decode enable signal Dn is enabled, to detect and correct the erroneous data using the parity bits from the ECC array 2 and the data from the data array 1, and to output the corrected data.

Referring again to FIG. 3, when write operation (namely ECC encoding operation) is being performed, the flag bit generation module 5 is used to generate flag bit. The flag bit generation module 5 is controlled by burst chop (BC), X4, X8 and X16 signals as well as other external control signals (not illustrated) that can affect the data length. If the length of the data A written from the system is consistent with the data length N required by the ECC algorithm (i.e., if the combination of the external control signals makes the data length A equal to N), the flag bit generation module 5 generates a flag bit (for example "0") and an encode enable signal En enabling the operation of the ECC encoding module 3 (i.e., the encode enable signal is enabled). Furthermore, following the operation of the ECC encoding module 3 being enabled by the encode enable signal En, the ECC encode module 3 will generate M-bit ECC parity bits and write said parity bits into the corresponding ECC array 2, as shown at address 0 in FIG. 3.

If the length of the data A written from the system is inconsistent with the data length N required by the ECC algorithm (i.e., if the combination of the external control signals makes the data length A not equal to N), the flag bit generation module 5 generates a flag bit (for example "1") and an encode enable signal En disabling the operation of the ECC encoding module 3 (i.e., the encode enable signal is disabled). Furthermore, following the operation of the ECC encoding module 3 being disabled by the encode enable signal En, the ECC encode module 3 will generate no ECC parity bit, which can reduce the power dissipation, as shown at addresses 1 and 2 in FIG. 3. At address 1, K1=N/2; at address 2, K2=3*N/4; wherein K1 and K2 represent the data length.

Referring again to FIG. 4, when read operation (namely ECC decoding operation) is being performed, the flag bit detection module 7 is used to detect the flag bit stored in the flag bit array 6.

If the flag bit indicates that, when data is being written, the length of the data stored at a certain address is N (as shown at address 0), for example the flag bit is "0", which indicates that, when data is being written, the length of the data stored at address 0 is N, the flag bit detection module 7 generates a decode enable signal Dn (i.e., the decode enable signal is enabled) which may enable the ECC decoding module 4 to detect and correct errors in data A.

If the flag bit indicates that, when data is being written, the length of the data stored at a certain address is not equal to N (as shown at addresses 1 and 2), the flag bit detection module 7 generates a decode enable signal Dn, which can disable the operation of the ECC decoding module 4 (i.e., the decode enable signal is disabled), and no ECC decoding operation is performed. Address 1 indicates that, when data is being written, only K1-bit data (K1=N/2) have been written into address 1, in other words, after the write operation, there are K1-bit valid data in the N-bit data at address 1; address 2 indicates that, when data is being written, only K2-bit data (K2=3*N/4) have been written into address 2, in other words, after the write operation, there are K2-bit valid data in the N-bit data at address 2. The flag bit being "1" indicates that, when data is being written, the length of the N-bit data stored at the address (such as, address 1 or address 2) is not equal to N; in other words, it indicates that, when data is being written, the data stored at the address (such as, address 1 or address 2) generates no parity bit.

It should be noted that address 0, address 1 and address 2 mentioned above are only for indicating different addresses, rather than the real addresses 0, 1 and 2 in the memory. The data length which is inconsistent with N is not limited to two lengths K1=N/2 and K2=3*N/4, and any other data length which is inconsistent with N is suitable.

The above description of the present invention is not intended to be exhaustive or to limit the invention to the precise forms disclosed. Although specific embodiments and examples of the present invention are described herein for illustrative purposes, there may be many equivalent modifications without departing from the sprits and scope of the invention. The word "comprising" does not exclude the presence of elements or steps other than those listed in a claim, "a" or "an" does not exclude a plurality, and a single feature or other unit may fulfill the functions of several units recited in the claims. Any reference signs in the claims shall not be construed so as to limit their scope.

The invention claimed is:

1. A memory with error correction function, wherein the memory comprises a data array, an ECC array, a flag bit array, an ECC encoding module, an ECC decoding module, a flag bit generation module and a flag bit detection module; wherein:
the data array is configured to store data;
the flag bit generation module is configured, when data is being stored, to generate a flag bit and an encode enable signal in response to the one or more external control signals that affect the length of the data, the flag bit being stored in the flag bit array, and the encode enable signal being used to control the operation of the ECC encoding module;
the ECC encoding module is configured, when the encode enable signal is enabled, to receive the data and encode the data according to the ECC algorithm preset therein to generate parity bits;
the ECC array is configured to store the generated parity bits;
when data is being read from the data array, the flag bit detection module is configured to detect the flag bit, and in response to the flag bit, to generate a decode enable signal for controlling the operation of the ECC decoding module; and
the ECC decoding module is configured, when the decode enable signal is enabled, to detect and correct erroneous data using the parity bits from the ECC array and the data from the data array, and to output the corrected data;
wherein the flag bit indicates whether the length of the data is equal or not equal to the data length required by the preset ECC algorithm.

2. The memory of claim 1, wherein the external control signals are signals corresponding to X4, X8 or X16 mode or signals corresponding to the combination of burst chop mode with one of X4, X8 and X16 modes.

3. The memory of claim 1, wherein if the length of the data is equal to the data length required by the preset ECC algorithm, the generated encode enable signal is an encode enable signal enabling the operation of the ECC encoding module; and if the length of the data is not equal to the data length required by the preset ECC algorithm, the generated encode enable signal is an encode enable signal disabling the operation of the ECC encoding module.

4. The memory of claim 1, wherein when data is being read from the data array, if the flag bit indicates that the length of the data stored at the corresponding address is equal to the data length required by the preset ECC algorithm, the generated decode enable signal is a decode enable signal enabling the operation of the ECC decoding module.

5. The memory of claim 1, wherein when data is being read from the data array, if the flag bit indicates that the length of the data stored at the corresponding address is not equal to the data length required by the preset ECC algorithm, the generated decode enable signal is a decode enable signal disabling the operation of the ECC decoding module.

6. A method of correcting errors in a memory, wherein the memory comprising a data array, an ECC array, a flag bit array, an ECC encoding module, an ECC decoding module, a flag bit generation module and a flag bit detection module, the method of correcting errors in the memory comprising:
when data is being written, storing the data in the data array and generating a flag bit and an encode enable signal by the flag bit generation module in response to the one or more external control signals that affect the length of the data;
storing the generated flag bit in the flag bit array and controlling the ECC encoding operation of the ECC encoding module according to the encode enable signal, wherein if the encode enable signal is enabled, performing ECC encoding of the data according to the preset ECC algorithm, and storing parity bits generated by ECC encoding;
when data is being read from the data array, detecting the flag bit by the flag bit detection module, and in response to the flag bit, generating a decode enable signal to control ECC decoding operation, wherein if the decode enable signal is enabled, performing ECC decoding and reading the data, and if the decode enable signal is disabled, performing no ECC decoding and reading the data;

wherein the flag bit indicates whether the length of the data is equal or not equal to the data length required by the preset ECC algorithm.

7. The method of correcting errors in a memory of claim 6, wherein the external control signals are signals corresponding to X4, X8 or X16 mode or signals corresponding to the combination of burst chop mode with one of X4, X8 and X16 modes.

8. The method of correcting errors in a memory of claim 6, wherein when data is being written, if the length of the data is equal to the data length required by the preset ECC algorithm, the generated encode enable signal is an encode enable signal enabling the operation of the ECC encoding module; and when data is being written, if the length of the data is not equal to the data length required by the preset ECC algorithm, the generated encode enable signal is an encode enable signal disabling the operation of the ECC encoding module.

9. The method of correcting errors in a memory of claim 6, wherein when data is being read from the data array, if the flag bit indicates that the length of the data stored at the corresponding address is equal to the data length required by the preset ECC algorithm, the generated decode enable signal is a decode enable signal enabling the operation of the ECC decoding module.

10. The method of correcting errors in a memory of claim 6, wherein when data is being read from the data array, if the flag bit indicates that the length of the data stored at the corresponding address is not equal to the data length required by the preset ECC algorithm, the generated decode enable signal is a decode enable signal disabling the operation of the ECC decoding module.

\* \* \* \* \*